United States Patent [19]

Blum et al.

[11] Patent Number: 5,532,426

[45] Date of Patent: Jul. 2, 1996

[54] SWITCH CABINET WITH SEALING ELEMENTS FOR SEALING A DOOR WHEN CLOSED

[75] Inventors: Richard Blum, Dietzenbach; Hans-Michael Groh, Hainburg; Willi Kuester, Gelnhausen; Klaus-Jürgen Herr, Linsengericht, all of Germany

[73] Assignee: Siemens Aktiengesellschaft, Stuttgart, Germany

[21] Appl. No.: 112,743

[22] Filed: Aug. 26, 1993

[30] Foreign Application Priority Data

Aug. 26, 1992 [DE] Germany .............. 42 28 427.9

[51] Int. Cl.[6] .................................. H05K 9/00
[52] U.S. Cl. ................. 174/356 C; 277/207 R
[58] Field of Search ............ 174/35 R, 356 C, 174/35 MS; 156/130.7, 131, 276; 413/9, 42; 277/207 R, 189, 901, 34.3; 49/383, 475.1, 478.1, 489.1, 493.1, 490.1

[56] References Cited

U.S. PATENT DOCUMENTS 4,857,668  8/1989  Buonanno ...................... 174/35 R
4,864,076  9/1989  Stickney ........................ 174/356 C
5,028,739  7/1991  Keyser et al. ................. 174/356 C
5,045,635  9/1991  Kaplo et al. .................. 174/356 C
5,115,104  5/1992  Bunyan .......................... 174/356 C
5,160,806  11/1992 Harada et al. ................. 174/356 C

FOREIGN PATENT DOCUMENTS 0176619  4/1986  European Pat. Off. .
3920353  12/1990 Germany .
4022079  1/1992  Germany .
2036840  7/1980  United Kingdom .

*Primary Examiner*—Kristine L. Kincaid
*Assistant Examiner*—Christopher Horgan
*Attorney, Agent, or Firm*—Kenyon & Kenyon

[57] ABSTRACT

A switch cabinet has a door that is provided with a sealing element made of elastic rubber material. The sealing element has a top bead with a cavity, as well as a fastening strip with a self-adhesive adhesion layer. The sealing element contacts one rim flange by means of the fastening strip and the adhesion layer. A friction-reducing coating can be applied onto an end surface intended to rest against a front surface of the switch cabinet or onto an adjacent side surface.

11 Claims, 2 Drawing Sheets

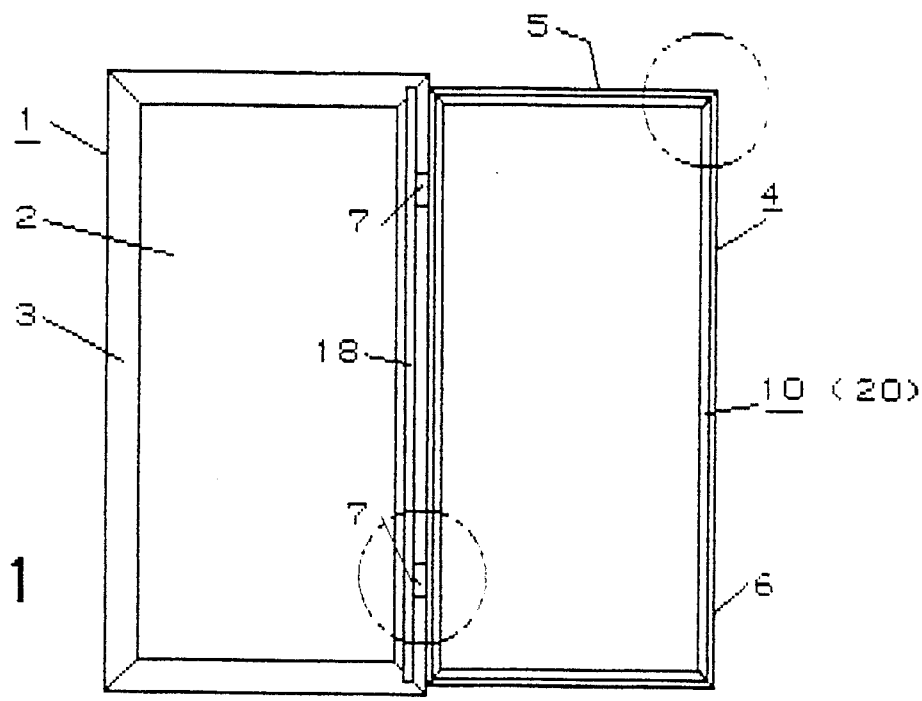
FIG 1
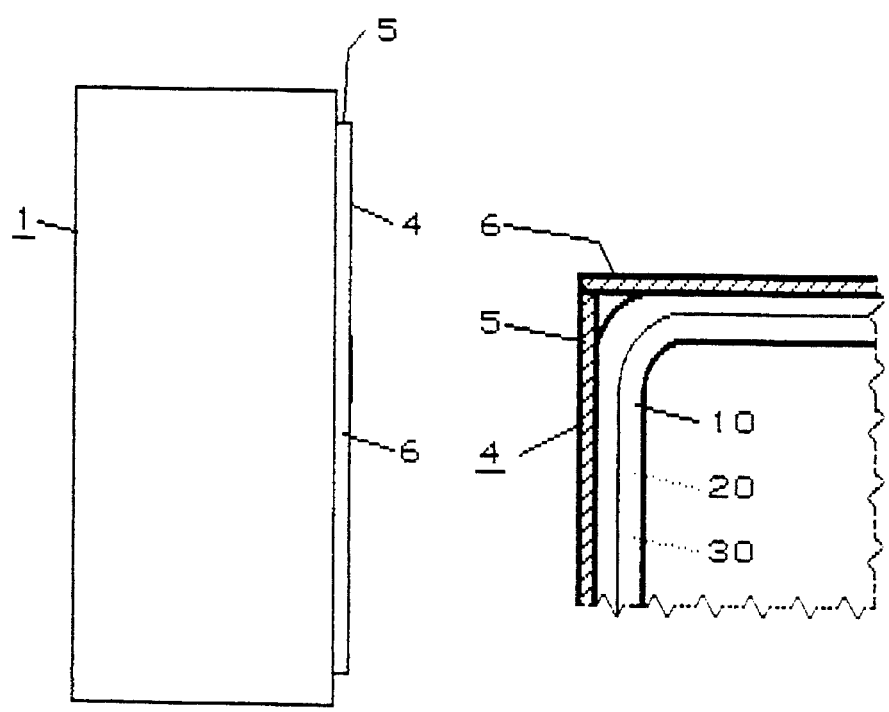
FIG 2
FIG 8

SWITCH CABINET WITH SEALING ELEMENTS FOR SEALING A DOOR WHEN CLOSED

BACKGROUND OF THE INVENTION

The present invention relates to a switch cabinet and more particularly to a cabinet having a front surface, formed by frame parts, for contact with a door that has rim flanges bent up in the direction of the front surface and sealing elements made of elastic rubber material for sealing when the door is closed.

A switch cabinet of this kind has been disclosed, for example, by DE-A-39 20 353. To retain the sealing elements, the rim flanges of the door are profiled so as to form a groove or channel for insertion of the sealing element. It is also known to form such a groove or channel by giving the door smoothly bent rim flanges and fastening a frame that has edges running parallel to the rim flanges onto the inner side of the door. This creates the difficulty that special shaping of the rim flanges with their profiles or of the additional frame that is used is necessary in the region of the door hinges, so that the sealing elements can also contact the front surface of the switch cabinet in the desired manner in the hinge region.

SUMMARY OF THE INVENTION

The present invention provides a switch cabinet of the aforesaid type that eliminates profiles or retaining frames to receive the sealing elements, and at the same time achieves good sealing in the hinge region of the door. Additionally, the suitability of such a sealing arrangement for creating a switch cabinet sealed against electromagnetic radiation is enhanced.

According to an embodiment of the present invention, sealing elements have a hollow top bead intended to rest against a front surface of a switch cabinet. A fastening strip adjoins the top bead and is intended for application onto the rim flanges of the door by means of a self-adhesive adhesion layer. The fastening strip is recessed with respect to one side surface of the top bead by approximately the thickness of the adhesion layer. The adhesion layer can be applied onto the sealing elements when they are manufactured. On the other hand, the adhesion layer can be separately applied to the rim flanges of the door. In either case, all that is needed to assemble the sealing elements is to press them on firmly at their fastening strips. This makes superfluous any special profiling of the rim flanges, or additional frames that form a groove together with the rim flange. Since only the fastening strip is in permanent contact with the bent rim flange of the door, the top bead can be bent laterally and, because of its hollow design, also compressed to a certain degree. These features result in relatively good adaptation of the sealing element to the surface of the front surface of the switch cabinet. In particular, the sealing element is also capable of providing the desired sealing in the region of a foot portion of a hinge resting on the front surface.

While those sealing elements or segments thereof that are a certain distance away from the hinges of the door encounter the front surface of the switch cabinet essentially rectilinearly and perpendicularly when the door is closed, the segments of the sealing elements located closer to the hinges are subject to stress from sliding friction. According to a further embodiment of the present invention, this friction can be substantially reduced by the fact that at least the sealing element to be used on the hinge side of the door has a friction-reducing coating. This coating can, for example, consist of a flock coating of unoriented fibers. A flock coating of this kind is nondetachably joined to the material of the sealing element when it is manufactured.

The friction-reducing coating can be applied onto the end surface of the top bead of the sealing element that is designed to rest against the front surface of the switch cabinet, while a velvet-like textile tape is fastened onto the front surface itself. As a result of this arrangement, when the door is closed there is a high level of sealing against incident water or other media, despite the reduction in friction.

It is also possible, however, for the friction-reducing coating to be applied to the outward-facing side surface of the top bead of the sealing element. When the door is closed, the sealing element then acts in such a way that the top bead is first bent with respect to the fastening strip, under the effect of the increasing friction, until the edge provided with the coating rests against the front surface of the switch cabinet, and further movement can proceed with low friction. At the same time, the linear contact of the sealing element raises the edge pressure so as to produce the desired sealing. In this context, it proves to be advantageous if the top bead of the sealing element intended to rest against the front surface of the switch cabinet has a flute and two sealing lips formed thereby. This configuration can moreover be used advantageously to improve sealing independently of the application of a friction-reducing coating onto the side surface of the top bead. If the embodiment with a friction-reducing coating is selected, sealing against an external pressure can be enhanced by the fact that the coating is kept off the region immediately adjacent to the outer edge or lip.

The forms of sealing elements described above can be sheathed in an electrically conductive coating, the fastening strip being designed as the contact lug to the door. This results in good switch cabinet sealing with respect to electromagnetic radiation as well.

If a hinge design is used that has a hinge foot resting on the front surface of the switch cabinet, it then proves to be favorable for sealing if support members for the sealing element are applied to the door near the hinges. Such support members improve application pressure so as to close off gaps between the sealing element and the hinge foot.

BRIEF DESCRIPTION OF THE DRAWINGS

The present invention will be explained in greater detail below with reference to the exemplary embodiments depicted in the drawing figures.

FIG. 1 shows a schematic front view of a switch cabinet with its door open.

FIG. 2 depicts the switch cabinet according to FIG. 1 in a side view, with its door closed.

FIG. 8 shows a support member for a sealing element in conjunction with a hinge, and a portion of a frame of the switch cabinet according to an embodiment of the invention.

DETAILED DESCRIPTION

Figure 3:
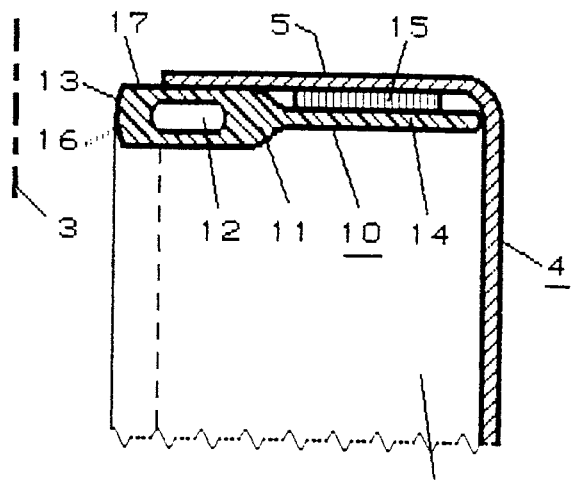
FIGS. 3 and 4 show different embodiments of a sealing element together with a segment of the door of the switch cabinets.

The switch cabinet 1 shown in FIGS. 1 and 2 has a cabinet body 2 with a front surface 3 against which a door 4 is intended to rest. Door 4 has rim flanges 5 and 6 bent up at right angles; 5 designates the rim flanges along the narrow sides and 6 the rim flanges along the long sides. Hinges 7 permit the door 4 to pivot. In FIG. 1 door 4 is shown opened 180 degrees, while in FIG. 2 it is shown closed.

Figure 7:
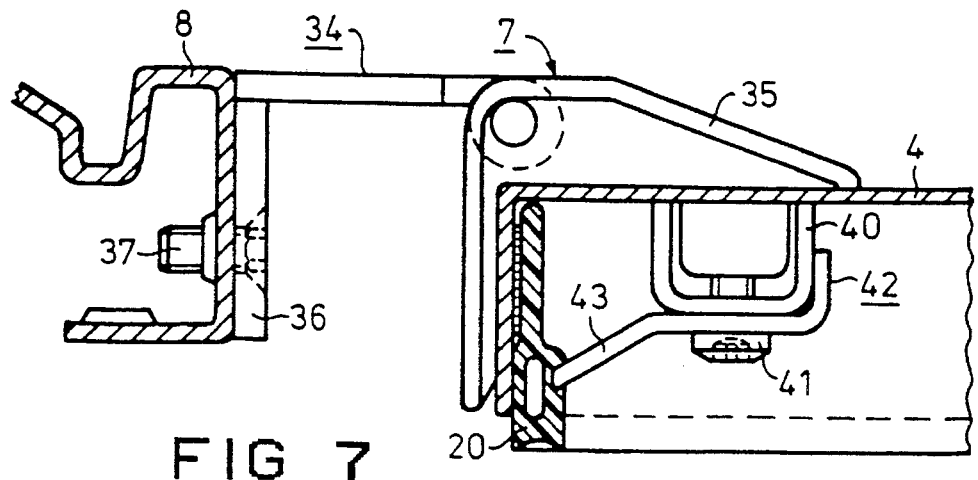
FIG. 7 depicts the arrangement of a sealing element in the region of one corner of a door of the switch cabinet.

Cabinet body 2 can have a frame or framework corresponding approximately to DE-A-39 20 353. A frame part 8 is shown in FIG. 7 in section. A suitable hinge configuration is evident from DE-A-40 22 079. FIG. 1 shows only two hinges 7. Depending on the height and weight of door 4, three or more hinges 7 can also be provided.

Dashed circles in FIG. 1 identify regions of door 4 of which details are depicted in an enlarged scale in FIGS. 3, 4, 5, 6, and 7. First of all two embodiments of a sealing element 10 and 20, schematically indicated in FIG. 1, will be explained with reference to FIGS. 3 and 4.

FIG. 3 shows sealing element 10 in section, in a corner of door 4 defined by rim flanges 5 and 6. Sealing element 10 has a top bead 11, intended to rest against front surface 3 of switch cabinet 1 (FIG. 1). The top bead has a cavity 12. End surface 13 of sealing element 10 is convex. Adjoining top bead 11, sealing element 10 has a fastening strip 14 with a reduced thickness compared with that of top bead 11. A portion of side surface 17 of top bead 11 lies against rim flanges 5 and 6. A self-adhesive adhesion layer 15 is applied onto fastening strip 14, which is recessed as compared with side surface 17. Thus no special retaining devices or profiles are required on door 4 to install sealing element 10. Instead all that is necessary is to pull off a protective film applied onto self-adhesive adhesion layer 15 when sealing element 10 is manufactured, lay fastening strip 14 of sealing element 10 on rim flange 5 of door 4, and press. Sealing element 10 can be made, in a known manner, of an elastic rubber material. Because of cavity 12, top bead 11 can deform under the pressure which occurs when door 4 is closed, and therefore rests in a sealed manner against front surface 3 of cabinet body 2 over the entire periphery of door 4.

Figure 4:
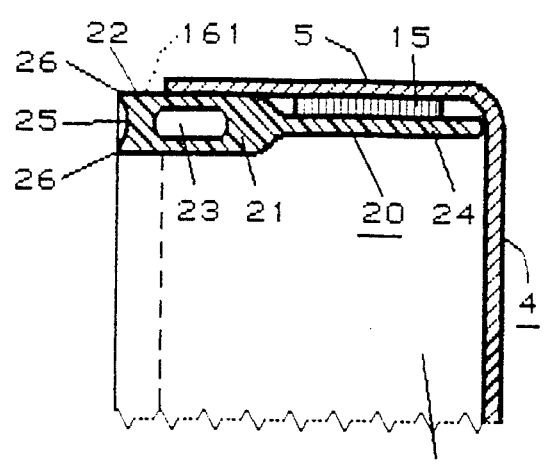

Sealing element 20 of FIG. 4 corresponds largely to the sealing element 10 of FIG. 3. Sealing element 20 accordingly has a top bead 21 with a side surface 22 and a cavity 23, and furthermore a fastening strip 24 with a self-adhesive adhesion layer 15. The configuration of the end surface of top bead 21 is different, however: it is provided with a flute 25 and two sealing lips 26 formed thereby.

In principle the two sealing elements 10 and 20 shown in FIGS. 3 and 4 can be used over the entire periphery of door 4. However, to meet the particular requirements that exist on the hinge side of the door, special measures can be taken to provide both good sealing and the least possible wear on the sealing elements in this region. For this purpose, according to FIG. 5 in particular, a friction-reducing coating 16 according to FIG. 5 can be applied onto end surface 13 of sealing element 10. This is advantageously produced while the sealing element itself is being manufactured, as a flock coating with unoriented fibers. The coating is therefore nondetachably joined to the basic elastic rubber material of sealing element 10. Because of the reduced friction, sealing element 10 can slide sideways, after contact, on the side of cabinet body 2 (FIG. 1) provided with hinges 7, without thereby damaging top bead 11 or bending it with respect to fastening strip 14.

Figure 5:
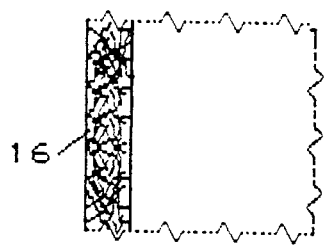
FIG. 5 shows a friction-reducing coating of a sealing element.

If sufficient sealing is not achieved in conjunction with coating 16 according to FIG. 5, the segment of front surface 3 provided with hinges 7 can be covered with a velvet tape 18 indicated in FIG. 1. Entrainment of the fiber elements of velvet tape 18 by coating 16 produces a macroscopic structure counteracting the infiltration of media from outside when door 4 is closed, which improves sealing.

A layer corresponding to coating 16 in FIG. 5 can, however, also be applied onto the outward-facing side surface 17 of top bead 11 of sealing element 10 according to FIG. 3, or onto side surface 22 of top bead 21 according to FIG. 4. The coatings then act so that the fibers, as a result of the slight bending of top bead 11 or 21 which occurs because of the friction between sealing element 10 or 20 when door 4 is closed, come to rest at the edge against front surface 3. Good sealing nevertheless results because the sealing element rests against front surface 3 along a narrow edge. This process occurs in a particularly pronounced fashion with sealing element 20 provided with sealing lips 26, and can be improved even further by keeping the coating off the immediate edge region of the sealing element.

Figure 6:
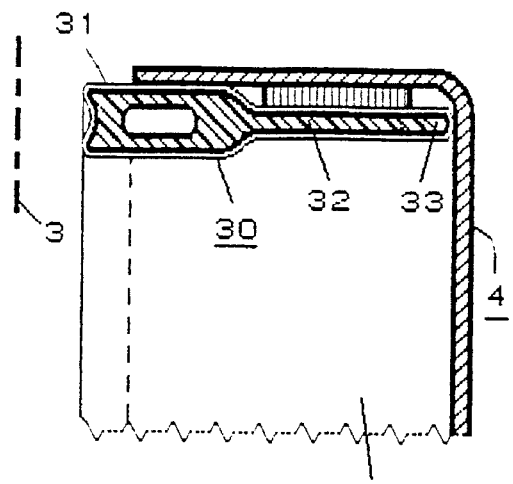
FIG. 6 shows a sealing element for more stringent requirements in terms of electromagnetic compatibility.

Sealing element 30 according to FIG. 6 is suitable for stringent requirements regarding electromagnetic compatibility (EMC). Sealing element 30 has a configuration similar to that of sealing element 20 according to FIG. 4, but is completely sheathed in an electrically conductive coating 31. This can consist, for example, of a conductive outer layer of the elastic rubber material or, in a particularly effective manner, of a fine metal fabric. Fastening strip 32 is designed as a contact lug 33 which rests on door 4. It is recommended that front surface 3 and the inner side of door 4 be made of bare metal, for example by means of nickel plating or the like. A sealing element 30 seals the gap between front surface 3 and door 4 in an electrically effective manner, improving sealing against any passage of electromagnetic interference.

As already mentioned, the sealing elements described above are also suitable, because of their good adaptability, for the region of hinges 7 of FIG. 1. Gap-free seating of the sealing elements at these points is particularly advantageous when stationary hinge parts, intended to be mounted on front surface 3 of cabinet body 2, are provided as described, for example, in aforementioned DE-A-40 22 079. To illustrate the position of the parts which results in this case, FIG. 7 shows a frame part 8 of cabinet body 2 with one stationary hinge arm 34 and one movable hinge arm 35. Stationary hinge arm 34 is fastened at its foot part 31 by means of a screw 37 to frame part 8 of cabinet body 2. Door 4, provided with a sealing element 20 according to FIG. 4, is depicted in a 90-degree opened position. Movable hinge arm 35 is fastened to door 4 by means of a U-bolt 40 and a screw 41. Also fastened by means of screw 41 is a support member 42 which has support arms 43 which push against top bead 21. This prevents top bead 21 from deflecting when door 4 closes and top bead 21 consequently encounters foot part 36 of stationary hinge arm 34. Instead increased application pressure occurs, with correspondingly greater sealing.

FIG. 8 additionally illustrates the application of sealing elements 10 and 20 in the region of a corner of door 4. As is evident, sealing element 10 or 20 can be extended in a curved shape without interruption from bent flange 5 to flange 6. The fact that because of the curved profile, a small corner region of door 4 is not filled by the sealing element, is immaterial as far as sealing is concerned.

What is claimed is:

1. A sealing arrangement for a switch cabinet having a door, wherein the switch cabinet has a front surface and is formed by frame parts and wherein the door has rim flanges bent in the direction of the front surface of the switch cabinet and the door is attached on one side to the switch cabinet by at least one hinge, the sealing arrangement comprising:

- at least one sealing element made of elastic rubber material for sealing when the door is closed, said at least one sealing element having a hollow top bead intended to rest against the front surface, the top bead having an end surface and, adjoining said top bead, a fastening strip intended for application onto one of the rim flanges of the door; and
- a self-adhesive adhesion layer adapted to fasten the fastening strip to one of the rim flanges, wherein said fastening strip is recessed with respect to one side surface of the top bead by approximately the thickness of the adhesion layer.

2. The arrangement of claim 1, wherein said at least one sealing element which is to be used on the hinge side of the door is provided with a friction-reducing coating to reduce friction when the door is opened and closed.

3. The arrangement of claim 2, wherein the friction-reducing coating consists essentially of a flock coating of unoriented fibers.

4. The arrangement of claim 3, further comprising a velvet-like textile tape fastened onto the front surface, and wherein said friction-reducing coating of unoriented fibers is applied onto the end surface of the top bead of the at least one sealing element wherein the friction-reducing coating on the end surface of the top bead is designed to rest against the front surface of the switch cabinet.

5. The arrangement of claim 3, wherein the friction-reducing coating is applied to an outward-facing side surface of the top bead of the at least one sealing element.

6. The arrangement of any one of claims 2 to 5, wherein the top bead of the at least one sealing element intended to rest against the front surface of the switch cabinet has a flute and two sealing lips formed by said flute.

7. The arrangement of claim 1, wherein the top bead of the sealing element intended to rest against the front surface of the switch cabinet has a flute and two sealing lips formed by that flute.

8. The arrangement of claim 5, wherein the friction-reducing coating is kept off the region immediately adjacent to an outer edge of the at least one sealing element.

9. The arrangement of claim 6, wherein the friction-reducing coating is kept off the region immediately adjacent to an outer edge of the at least one sealing element.

10. The arrangement of any one of claims 1 to 5 or 7 to 8, wherein the at least one sealing element is sheathed in an electrically conductive coating, and the fastening strip is designed as a contact lug to the door.

11. The arrangement of any one of claims 1 to 5 or 7 to 8, further comprising support members applied to the door near the at least one hinge, wherein the support members have support arms for fixing the at least one sealing element in position.

* * * * *